United States Patent [19]

Mohr

[11] Patent Number: 4,937,170

[45] Date of Patent: Jun. 26, 1990

[54] COUPLING AGENTS FOR PHOTOGRAPHIC ELEMENTS

[75] Inventor: Dieter Mohr, Roemerberg II, Fed. Rep. of Germany

[73] Assignee: Hoechst Celanese Corporation, Somerville, N.J.

[21] Appl. No.: 162,703

[22] Filed: Mar. 1, 1988

Related U.S. Application Data

[63] Continuation of Ser. No. 443,079, Nov. 19, 1982, abandoned.

[51] Int. Cl.$^5$ ............................ G03F 7/08; G03C 5/34
[52] U.S. Cl. ..................................... 430/147; 430/142; 430/145; 430/149; 430/175; 430/176; 430/180; 430/181; 430/292; 430/300; 430/302
[58] Field of Search ............... 430/149, 325, 302, 300, 430/292, 145, 147, 142, 175, 176, 180, 181

[56] References Cited

U.S. PATENT DOCUMENTS

| 2,063,631 | 12/1936 | Schmidt et al. | 430/302 |
|---|---|---|---|
| 2,516,931 | 8/1950 | von Glahn et al. | 430/181 |
| 2,694,010 | 11/1954 | Botkin et al. | 430/180 |
| 2,871,119 | 1/1959 | Weegar et al. | 430/175 |
| 3,149,972 | 9/1964 | Herrick et al. | 430/176 |
| 3,373,021 | 3/1968 | Adams et al. | 430/175 |
| 3,679,419 | 7/1972 | Gillich | 430/302 |
| 3,867,147 | 2/1975 | Teuscher | 430/302 |
| 4,446,218 | 5/1984 | Dhillon | 430/175 |

FOREIGN PATENT DOCUMENTS

| 24872 | 3/1981 | European Pat. Off. | 430/302 |
|---|---|---|---|
| 44-30902 | 11/1969 | Japan | 430/169 |
| 54-36491 | 11/1979 | Japan | 430/149 |
| 56-119130 | 9/1981 | Japan | 430/145 |
| 2087580 | 5/1982 | United Kingdom | 430/144 |

*Primary Examiner*—Charles L. Bowers, Jr.
*Attorney, Agent, or Firm*—Plottel & Roberts

[57] ABSTRACT

A photographic element formed from a substrate and light sensitive coating on the substrate wherein the coating comprises a mixture of a diazo compound and an aromatic carboxylic coupling agent having phenolic hydroxy groups, in an acidic medium.

20 Claims, No Drawings

COUPLING AGENTS FOR PHOTOGRAPHIC ELEMENTS

This is a continuation of co-pending application Ser. No. 443,079 filed on Nov. 19, 1982, now abandoned.

BACKGROUND OF THE INVENTION

The present invention relates to photographic elements, or more particularly to lithographic printing plates.

It is well known that most lithographic printing plates are formed by coating a diazo containing light sensitive composition onto an aluminum or treated aluminum substrate. Such a plate is exposed through a photographic mask to ultraviolet or actinic radiation thus causing the diazonium compound to decompose in the light struck image areas. The unexposed non-image areas still contain nondecomposed diazo and is removed by developing. One problem with such plates is that after exposure such plates still contain a certain amount of nondecomposed diazo in the image areas. The undecomposed diazo is sensitive to reaction to certain ingredients present in the developer, finisher or the fountain solution. Therefore, such a reaction might cause more hydrophilic areas on the surface of the coating and lead to a reduced ink receptivity in these areas. These problems manifest themselves in slow rollup, blinding, and poor contrast as demonstrated by many step wedge ghost steps.

It has been known in the art that non-light sensitive azo dyes can be produced by reacting diazo compounds with phenolic coupling agents under certain conditions. One approach to combine these features is described in European Patent Application No. 0024872. After the non-image active diazo portion is removed by development, the plate with only the image areas remaining is treated with a finisher to eliminate the active diazo in the image parts.

The disadvantage of this method is that only active diazo molecules on the surface of the image areas can be destroyed. Penetration of the diazo eliminating compounds substantially into the coating is not possible. Therefore, after a certain wear off of the coating during the press run, there are again active diazo molecules in the surface of image areas which are able to react with hydrophilic ingredients of the fountain solution or cleaning solutions used during machine down times.

U.S. Pat. Nos. 3,300,309 and 4,171,974 discuss the formation of light sensitive reaction products of diazonium salts and "coupling agents". However, such are not true coupling reactions. The reactions described in these disclosures are counter-ion replacement reactions whereby a water soluble diazonium salt $ArN_2^-X^+$ has its $X^+$ ion replaced with an aromatic hydroxy containing compound such that the new compound remains light sensitive but is rendered water insoluble. This is contrasted with true coupling reactions whereby the diazo is reacted to form a non-light sensitive azo compound of the formula:

Ar-N=N-Ar'

The present invention provides a negative working light sensitive coating containing a light sensitive diazonium salt in a stable, non-reacted, physical admixture with an aromatic carboxylic coupling agent in an acidic medium. The coating is preferably applied to a lithographic substrate and exposed to actinic radiation through a photographic mask. The coating is then developed with an alkaline developer such that the removal of the unexposed non-image areas is faster than the coupling reaction. This is necessary since the unexposed areas are almost exclusively diazo and will couple with the developer alkali. The developer effectively couples any reactive diazo remaining in the image areas.

The incorporation of couplers in the coating allows substantial elimination of active diazo in the bulk of the coating because the hydroxyl ions which promote the coupling reaction are very well able to penetrate to the bottom of the coating.

The composition of the present invention provides a stable physical admixture of a diazonium salt and certain aromatic carboxylic compounds having phenolic hydroxyl groups, in an acidic medium. The compositions provide improved light speed and development speed. Furthermore, in unexposed non-image areas the alkali developer has a faster dissolution speed than coupling speed. However, in almost totally exposed areas with a reduced solubility in the developer, the coupling reaction becomes predominant over the dissolution. In that way, additional solid steps are chemically formed by the reaction of diazo and coupler for a effective increase in practical light speed. Active diazo molecules remaining in image areas after exposure are deactivated by converting into an azo dye. Such a highly light sensitive coating is useful for laser imaging systems.

SUMMARY OF THE INVENTION

The invention provides a light sensitive composition comprising a Substantially non-reacted admixture of a light sensitive diazonium compound and an aromatic carboxylic coupling agent in an acidic medium, said coupling agent having the general formula:

$$[Ar(OH)_m (COX)_n]_p Y_q$$

with
Ar=$C_6H_{6-(m+n)}$, $C_{10}H_{8-(m+n)}$ or $C_6H_{5-(m+n)}$B, $C_{10}H_{7-(m+n)}$B with B=Br or —$CH_3$
X=—OH; —$NR_2$; —NHR or halogenide
R=—H or —$C_aH_b(OH)_c$ with a=1–4, b=3–9, c=0–1
Y=—O—, —S— or a carbon based briding group like
—$CH_2$—,

—$C_dH_{2d}$—; etc.
m=1–3
n=1–2
p=1–2
q=0–1
d=1–8

The invention also provides a photographic element which comprises a substrate and the above composition coated on said substrate.

DETAILED DESCRIPTION OF THE PREFERRED EMBODIMENT

As hereinbefore described, the invention provides a light sensitive composition comprising a stable, substantially non-precipitating, non-reacted admixture of a negative working diazonium compound and an aromatic carboxylic coupling agent having phenolic hydroxyl groups, in an acidic medium. Negative working diazonium compounds useful for this invention have the general formula $ArN_2^+X^-$ wherein Ar is an aromatic nucleus and $X^-$ is an acid ion. They can be monomeric or polymeric and can be mono or polysubstituted with hydrogen, halogen, alkyl, carboxy, alkoxy, acetoxy, carbamyl, nitro, phenyl or amine groups around the aromatic nucleus. Typical diazo compounds are disclosed on pages 194–214 and 321–330 of the volume "Light Sensitive Systems" by Jaromir Kosar, John Wiley & Sons, Inc., New York, 1965.

Examples of compounds following the general coupling agent formula mentioned are:

| | |
|---|---|
| 3,5-Resorcylic Acid | |
| 2,4-Resorcylic Acid | $C_6H_3(OH)_2$ COOH. |
| 2,6-Resorcylic Acid | |
| 4-Bromo-3,5-Resorcylic Acid | $C_6H_2Br(OH)_2$ COOH |
| 2,3-Dihydroxy Naphthoic Acid | $C_{10}H_5(OH)_2$ COOH |
| 3,5-Resorcylic Acid Ethanolamide | $C_6H_3(OH)_2$ CONH $C_2H_4OH$ |
| 3,5-Resorcylic Acid Chloride | $C_6H_3(OH)_2$ COCl |
| 3,5-Resorcylic Acid Diethanolamide | $C_6H_3(OH)_2$ CON$(C_2H_4OH)_2$ |
| 2,4-Resorcylic Acid Ethanolamide | $C_6H_3(OH)_2$ CONH$C_2H_4OH$ |
| 2,4-Resorcylic Acid Amide | $C_6H_3(OH)_2$ CONH$_2$ |
| 4-Bromo-3,5-Resorcylic Acid Amide | $C_6H_2Br(OH)_2$ CONH$_2$ |
| 2-Hydroxy-4-Methyl Benzoic Acid | $C_6H_3(CH_3)$ (OH)COOH |
| Salicylic Acid | $C_6H_4$(OH)COOH |
| 2,4,7-Trihydroxy Naphthoic Acid | $C_{10}H_4(OH)_3$COOH |
| 2,4-Dihydroxy Naphthalic Acid | $C_{10}H_4(OH)_2(COOH)_2$ |
| 3,5,3',5'-Tetrahydroxy 2,2'Biphenyldicarboxylic Acid | $[C_6H_2(OH)_2(COOH)]_2$ |
| 3,5,3',5'-Tetrahydroxy Biphenyl-sulfide-4,4'-Carboxylic Acid | $[C_6H_2(OH)_2(COOH)]_2$ S |

Such compounds are added to the diazo containing coating solution in a concentration of 5 to 40% (calculated to the amount of diazo), preferably 7.5 to 25%, more preferably 10 to 20%.

The composition may optionally contain other compatible ingredients such as solvents, acids, colorants, resins and other art recognized additives.

The acidic medium may be provided by adding certain compatible acids to the composition. These may include both mineral and organic acids. Non-exclusive examples of such acids include sulfonic acids, phosphonic acid, phosphoric acid, sulfuric acid, acetic acid, citric acid, oxalic acid and p-toluene sulfonic acid. The acids are perferably present in an amount of from about 0.1% to 20% based on the weight of diazo. A more preferred range is 1 to 10%.

In the construction of the photographic elements of the present invention, the light sensitive composition is coated onto a suitable substrate and dried. Suitable substrates include aluminum alloys, silicon and polymer film bases. The most preferred substrate is a lithographic grade aluminum alloy which may have had art recognized surface treatments performed on it. When such is the case, a sheet metal substrate, perferably aluminum and the alloys thereof especially those aluminum compositions suitable for the manufacture of lithographic printing plates such as Alcoa 3003 and Alcoa 1100, which may or may not have been pre-treated by standard graining and/or etching techniques as are well known in the art, may be coated by spraying, brushing, dipping or other means with a composition suitable for use as a hydrophilizing interlayer for lithographic plates. Standard metal substrate pretreatments include chemical etching, chemical or mechanical graining and anodizing by methods which are known to the skilled worker. Coating compositions employable in the practice of this invention include aqueous solutions of a hydrophilizing compound such as alkali silicate, silicic acid, the Group IV-B metal fluorides, the alkali metal salts, polyvinyl phosphonic acid, polyacrylic acid, the alkali zirconium fluorides, such as potassium zirconium hexafluoride, or hydrofluozirconic acid in concentrations of 0.5 to 20% by volume. A preferred concentration range is from 3 to 8% and the most preferred range is from 4 to 5%.

Anodizing may be performed by electrolytically treating the coated substrate in an aqueous solution of sulfuric, chromic, or phosphoric acid having a concentration of from about 0.5 to 25% by weight of acid in water. Anodizing perferably takes place in a bath maintained at a temperature of from about 15° C. to 35° C. for about from 1 to about 20 minutes at about from 5 to 20 volts and at a current density of about from 10 to 70 amperes per square foot.

Next, the light sensitive composition of this invention may be coated onto the substrate and dried. The thusly produced photographic element may then be exposed to ultraviolet or actinic radiation through a photographic mask and developed.

Typical developer compositions are alkaline in nature and have a pH ranging from above about 7.5 to about 12. Preferably the pH ranges from about 9 to 11. Developers are perferably formed from aqueous solutions of phosphates and or silicates. Such non-exclusively include mono-, di- and tri- alkali metal phosphate, sodium silicate, alkali metal metasilicate. Alkali metal hydroxides may also be used although these are not perferred. The developers may also contain art recognized surfactants, buffers and other ingredients.

The following non-limiting examples serve to illustrate the invention.

EXAMPLES

Control 1

A mill finished aluminum foil (0.15 mm) is degreased in a NaOH aqueous solution at a temperature of 80° C. for 10 seconds. It is then electrochemically grained in a $Al(NO_3)_3 \cdot 9H_2O/HNO_3$ electrolyte with alternating current having a current density of $45A/dM^2$ to a depth of graining of 3.5 um. The graining step is followed by anodization in a $H_2SO_4/Al_2(SO_4)_2$ containing electrolyte. Finally, the substrate is conditioned with an aqueous solution of polyvinylphosphonic acid.

To prepare a presensitized lithographic printing plate, the substrate is coated with the following solution:
4.6% of a poly condensation product of 1 mol 3-Methoxydiphenylamine-4-diazonium sulfate and 1 mol 4,4'-Bis-methoxy methyl-diphenylether, precipitated as Mesitylensulfonate.
0.1% $H_3PO_4$ (85%)
0.3% Victoria Pure Blue
95% Methyl Cellosolve
The coating weight is adjusted to 800 mg/m$^2$.

A printing plate prepared in this way and exposed to UV light through a negative flat shows a visible image after exposure. The development with a solution (pH=11) of:
5% Sodiumdecylsulfate 1% Sodium Metasilicate Pentahydrate ($Na_3SiO_3.5H_2O$)
1.5% Trisodiumphosphate decahydrate ($Na_3PO_4.12H_2O$)
in water is slow but acceptable.

By exposing the plate with 35 units (1 unit≈10 mJ/cm$^2$) through a Stouffer Step Wedge (21 Steps) a solid 6 and ghost 13 is produced after development with the mentioned solution.

The length of run is 70,000.

EXAMPLE 1

An aluminum substrate, as described in Control Example 1, is coated with a solution of:
4.6% Diazo, as described in Control 1
0.1% $H_3PO_4$(85%)
0.3% Victoria Pure Blue
0.92% 3,5-Resorcylic Acid Ethanolamide
94.08% Methyl Cellosolve
to a coating weight of 800 mg/m$^2$.

By exposing and processing such a plate in the same way as a plate prepared according to Control 1, the following advantages are observed:
0 improved contrast after exposure
0 faster development
0 increased light sensitivity (solid 9)
0 less ghost steps (ghost 13)
0 faster roll-up on the press
0 increased length of run (100,000 impressions)
0 improved storage stability By using an aqueous developer of a pH-value of about 8, the effect of the incorporated coupler on light sensitivity is slightly less (solid 7, ghost 11) because of a slower coupling reaction during development.

EXAMPLES 2-19

In Table I, the results in performance of different plates prepared according to this invention are listed in comparison to plates coated with the formulation of Control 1. For preparation of the samples, the substrate and the basic coating formulation of Control 1 are used. To that basic solution, different couplers are added in various amounts as indicated.

In the Table, the following explanations apply. The concentration of coupler is calculated to the amount of diazo. The pH value is the pH of the developer used to develop the plate. The solid value is the last solid step of a 21 Step Stouffer Step Wedge after development. The ghost value is the last ghost step of a 21 Step Stouffer Step Wedge after development. The roll-up value is the numbers of impressions needed to get an acceptable print. The storage stability value is determined by simulated storage of the plates at 100° C.
O = control or similar to control
+ = better than control sample with same coating weight
= = much better than control sample with same coating weight
C1 = control 1
C2 = control 2
C3 = control 3
E = example

TABLE 1

| Example | Coupler | Concentration % | Coating Weight mg/m$^2$ | Exposure Units | Contrast After Exposure | Development pH | | Stouffer Step Wedge Solid | Ghost | Roll-up | Storage Stability |
| --- | --- | --- | --- | --- | --- | --- | --- | --- | --- | --- | --- |
| C 1 | — | — | 800 | 35 | 0 | 11 | Hard | 6 | 13 | 300 | 0 |
| C 2 | — | — | 800 | 35 | 0 | 8 | Hard | 5 | 13 | 300 | 0 |
| C 3 | — | — | 400 | 25 | 0 | 11 | Easy | 5 | 12 | 300 | 0 |
| E 2 | 2,4-Resorcylic Acid Ethanolamide | 25 | 800 | 35 | ++ | 11 | Very Easy | 8 | 13 | 20 | ++ |
| E 3 | 2,4-Resorcylic Acid Ethanolamide | 20 | 800 | 35 | ++ | 11 | Very Easy | 9 | 13 | 20 | ++ |
| E 4 | 2,4-Resorcylic Acid Ethanolamide | 10 | 800 | 35 | + | 11 | Easy | 9 | 13 | 50 | + |
| E 5 | 2,4-Resorcylic Acid Ethanolamide | 5 | 800 | 35 | + | 11 | Hard | 7 | 12 | 100 | 0 |
| E 6 | 2,4-Resorcylic Acid Ethanolamide | 20 | 400 | 25 | ++ | 11 | Very Easy | 8 | 11 | 30 | ++ |
| E 7 | 2,4-Resorcylic Acid Ethanolamide | 20 | 400 | 25 | ++ | 8 | Very Easy | 7 | 10 | 40 | ++ |
| E 8 | 2,3-Hydroxy Naphthoic Acid Ethanolamide | 20 | 800 | 35 | ++ | 11 | Very Easy | 7 | 12 | 20 | 0 |
| E 9 | 2,4-Resorcylic Acid Amide | 20 | 800 | 35 | ++ | 11 | Very Easy | 9 | 13 | 40 | ++ |
| E10 | 4-Bromo-3,5-Resorcylic Acid | 30 | 800 | 35 | ++ | 11 | Very Easy | 6 | 9 | — | ++ |
| E11 | 4-Bromo-3,5-Resorcylic Acid | 20 | 800 | 35 | ++ | 11 | Very Easy | 8 | 12 | 30 | ++ |
| E12 | 4-Bromo-3,5-Resorcylic Acid | 10 | 800 | 35 | + | 11 | Easy | 8 | 12 | 30 | ++ |
| E13 | 4-Bromo-3,5-Resorcylic Acid | 5 | 800 | 35 | + | 11 | Easy | 7 | 12 | 110 | + |
| E14 | 4-Bromo-3,5-Resorcylic Acid | 2 | 800 | 35 | 0 | 11 | Hard | 6 | 13 | 300 | 0 |
| E15 | 4-Bromo-3,5-Resorcylic Acid | 20 | 400 | 25 | ++ | 11 | Very Easy | 9 | 12 | 20 | ++ |
| E16 | 4-Bromo-3,5-Resorcylic Acid | 10 | 400 | 25 | ++ | 11 | Very Easy | 8 | 11 | 30 | ++ |
| E17 | 4-Bromo-3,5-Resorcylic Acid | 20 | 800 | 35 | ++ | 11 | Very Easy | 8 | 13 | 60 | ++ |
| E18 | 2,6-Resorcylic Acid | 20 | 800 | 35 | ++ | 11 | Very Easy | 3 | 12 | 50 | 0 |
| E19 | 2-Hydroxy Naphthalene-3-Carboxylic Acid | 20 | 800 | 35 | ++ | 11 | Very Easy | 7 | 13 | 40 | + |

EXAMPLE 20

An aluminum substrate prepared according to Control 1, is coated with a solution of:
- 1.82% of a reaction product of polyvinyl butyral (MW=70,000–80,000) with propenylsulfonylisocyanate
- 1.8% of a condensation product of 3-methoxy-diphenylamine-4-diazonium hydrogen sulfate and 4,4'-bis-methoxy methyl-diphenylether, separated in the form of the mesitylene sulfonate salt
- 0.02% Phenylazodiphenylamine
- 0.07% $H_3PO_4$(85%)
- 0.09% Victoria Pure Blue FGA
- 0.2% 2,3-Hydroxy Naphthoic Acid Ethanolamide
- 60.0% Methyl Cellosolve
- 30.0% Tetrahydrofurane
- 6.0% Butylacetate to a coating weight of 1 g/m².

The plate is exposed with 35 exposure units and developed with a solution of:
- 5.0% Sodium Lauryl Sulfate
- 1.0% Sodium Metasilicate Pentahydrate
in 94.0% Water
and shows a solid 8 and ghost 13 (Stouffer Step Wedge). The same formulation without the coupler gives only 7 solid steps. The length of run of both plates is in the same range (150,000).

EXAMPLE 21

A slurry grained and anodized aluminum substrate conditioned with polyvinyl -phosphonic acid is coated with a solution of:
- 1.25% of a mixed polymer of styrene and maleic anhydride (Lytron)
- 2.5% Diazo from Control 1
- 0.01% Phenylazodiphenylamine
- 0.25% $H_3PO_4$(85%)
- 0.2% Sandolan Eosin EG (dye)
- 0.60% 2,6-Resorcylic Acid
- 95.19% Methyl Cellosolve to a coating weight of 1 g/m².

After exposure with 30 exposure units and development with the developer (pH=11) described in Control 1, the plate shows a solid 6 and ghost steps to 11. A control sample without coupler gives a solid 5 under same processing conditions.

EXAMPLE 22

A substrate, as described in Control 1, is coated with a solution of:
- 3.0% Diazo of Control 1
- 0.1% $H_3PO_4$(85%)
- 0.9% 4-Bromo-3,5-Resorcylic Acid
- and 96.0% Methyl Cellosolve to a coating weight of 800 mg/m².

This plate is exposed with 1 unit through a line flat. Development with the developer (pH=11) of control 1 produces a good mechanically and chemically resistant, red-brown image. The image areas are formed by the coupling reaction in those slightly exposed areas. In those areas, the solubility in the developer is decreased to an extent that the reaction of active diazo with coupler leading to an insoluble product becomes predominant. By using such a reaction to form an image, highly light sensitive coatings can be achieved. A control coating without coupler is totally removed by the developer.

EXAMPLE 23

A solution of 3% Diazo BBp (MRI Chemical Corp) and 0.6% 4-Bromo-3,5-Resorcylic Acid is wiped on a slurry grained and anodized substrate.

The plate is exposed to a solid step 6 using the developer of Control 1. By using the same exposure time, a control plate without coupler shows a solid 4. Similar effects on light sensitivity are also detected by using an aqueous developer of pH=8 or with Western Litho Jet-Black developer.

What is claimed is:

1. A method for producing a negative working lithographic printing plate which comprises providing a photographic element, which element comprises a substrate and a light sensitive composition on said substrate, said light sensitive composition comprising a substantially non-reacted admixture of a light sensitive polymeric diazonium condensate compound and a aromatic carboxylic coupling agent in an acidic medium, said coupling agent having the general formula:

$$\{Ar(OH)_m (COX)_n\}_p Y_q$$

wherein:
$Ar = C_6H_{6-(m+n)}$, 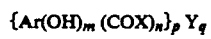 $C_{10}H_{8-(m+n)}$, $C_6H_{5-(m+n)}B$ or $C_{10}H_{7-(m+n)}B$
$B = Br$ or $-CH_3$
$X = -OH$; $[-NR_2, -NHR]$ or halogenide
$R = -H$ or $-C_aH_b(OH)_c$ with $a=1-4$, $b=3-9$, $c=0-1$;
$Y = -O-$, $-S-$, $-CH_2-$,

or $-C_dH_{2d}-$;
$m = 1-3$
$n = 1-2$
$p = 1-2$
$q = 0-1$
$d = 1-8$ and then imagewise exposing said element to actinic radiation to thereby reduce the solubility of the exposed areas in a developer, and then developing the element, thereby simultaneously removing the imagewise unexposed areas, while substantially not removing the imagewise exposed areas, and effecting a coupling reaction between the carboxylic coupling agent and residual diazonium compound in the imagewise exposed areas, wherein the developing is conducted with an aqueous alkaline developer.

2. The method of claim 1 wherein said coupling agent is 4-bromo,3,5-resorcylic acid.

3. The method of claim 1 wherein said diazonium compound is the reaction product of 3-methoxy diphenylamine-4-diazonium sulfate with 4,4'-bis methoxymethyl diphenylether precipitated as the mesitylenesulfonate salt.

4. The method of claim 1 wherein said acidic medium is provided by one or more mineral or organic acids.

5. The method of claim 1 wherein said acidic medium is provided by one or more acids selected from the group consisting of sulfonic acids, phosphonic acids, phosphoric acid, sulfuric acid, acetic acid, citric acid and oxalic acid.

6. The method of claim 1 wherein said acidic medium is present in an amount of from about 0.1% to about 20% based on the weight of the diazonium compound.

7. The method of claim 1 wherein said acidic medium is present in an amount of from about 1% to about 10% based on the weight of the diazonium compound.

8. The method of claim 4 wherein said acidic medium is present in an amount of from about 0.1% to about 20% based on the weight of the diazonium compound.

9. The method of claim 1 wherein said coupling agent is present in said composition in an amount ranging from about 5 to about 40% based on the weight of the diazonium compound.

10. The method of claim 1 wherein said coupling agent is present in said composition in an amount ranging from about 7.5 to about 25% based on the weight of the diazonium compound.

11. The method of claim 1 wherein said coupling agent is present in said composition in an amount ranging from about 10 to about 20% based on the weight of the diazonium compound.

12. The method of claim 1 wherein said composition further comprises one or more ingredients selected from the group consisting of solvents, resins, acids and colorants.

13. The method of claim 1 wherein said composition further comprises one or more ingredients selected from the group consisting of Methyl Cellosolve, methyl ethyl ketone, butyl acetate and tetrahydrofuran.

14. The method of claim 1 wherein said composition further comprises a copolymer of styrene and maleic anhydride.

15. The method of claim 1 wherein said developer comprises an aqueous alkaline solution.

16. The method of claim 1 wherein said developer has a pH of from about 7.5 to about 12.

17. The method of claim 1 wherein said developer comprises one or more ingredients selected from the group consisting of mono-, di- and tri- alkali metal phosphate, sodium silicate, alkali metal metasilicate, and alkali metal hydroxides.

18. The method of claim 1 wherein said substrate comprises a material selected from the group consisting of aluminum alloys, silicon, and polymeric films.

19. The method of claim 1 wherein said substrate comprises an aluminum alloy which has been subjected to one or more treatments selected from the group consisting of graining, etching, anodizing and hydrophilizing.

20. The method of claim 1 wherein said actinic radiation is ultraviolet radiation.

* * * * *